US010048491B2

United States Patent
Merli et al.

(10) Patent No.: US 10,048,491 B2
(45) Date of Patent: Aug. 14, 2018

(54) MEMS DEVICE OSCILLATING ABOUT TWO AXES AND HAVING A POSITION DETECTING SYSTEM, IN PARTICULAR OF A PIEZORESISTIVE TYPE

(71) Applicant: STMicroelectronics S.r.l., Agrate Brianza (IT)

(72) Inventors: Massimiliano Merli, Stradella (IT); Roberto Carminati, Piancogno (IT); Marco Rossi, Aicurzio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/266,063

(22) Filed: Sep. 15, 2016

(65) Prior Publication Data

US 2017/0285332 A1    Oct. 5, 2017

(30) Foreign Application Priority Data

Mar. 31, 2016    (IT) .................... 102016000033284

(51) Int. Cl.
*G02B 26/08*       (2006.01)
*H01L 41/09*       (2006.01)
(Continued)

(52) U.S. Cl.
CPC ............ *G02B 26/0858* (2013.01); *G01L 1/16* (2013.01); *G01L 1/18* (2013.01); *G01L 5/00* (2013.01);
(Continued)

(58) Field of Classification Search
CPC . G06F 3/0423; G02B 26/0858; G02B 26/101; G02B 26/0833; G02B 26/10;
(Continued)

(56) References Cited

U.S. PATENT DOCUMENTS 7,814,792 B2 * 10/2010 Tateyama ........... G01C 19/5607
73/504.12
7,849,741 B2 * 12/2010 Tateyama ........... G01C 19/5607
73/504.12
(Continued)

FOREIGN PATENT DOCUMENTS

DE        19857946 C1     1/2000
KR     20130038751 A      4/2013

OTHER PUBLICATIONS

Chi Zhang: "Two-Dimensional Micro Scanner Integrated with a Piezoelectric Actuator and Piezoresistors," Sensors, M D P I AG, CH, vol. 9, No. 1, Jan. 23, 2009, pp. 631-644, XP002620220.
(Continued)

*Primary Examiner* — Jonathan Dunlap
(74) *Attorney, Agent, or Firm* — Crowe & Dunlevy (57) ABSTRACT

A MEMS device includes a platform carried by a frame via elastic connection elements configured to enable rotation of the platform about a first axis. A bearing structure supports the frame through first and second elastic suspension arms configured to enable rotation of the frame about a second axis transverse to the first axis. The first and second elastic suspension arms are anchored to the bearing structure through respective anchorage portions arranged offset with respect to the second axis. A stress sensor formed by first and second sensor elements respectively arranged on the first and second suspension arms is positioned in proximity of the anchorage portions, on a same side of the second axis, in a symmetrical position with respect to the first axis.

21 Claims, 7 Drawing Sheets

(51) Int. Cl.
    *H03H 9/02*     (2006.01)
    *G01L 1/18*     (2006.01)
    *G01L 1/16*     (2006.01)
    *G01L 5/00*     (2006.01)
    *G02B 26/10*     (2006.01)
    *H04N 5/225*     (2006.01)
    *G06F 3/042*     (2006.01)

(52) U.S. Cl.
    CPC ............ *G02B 26/101* (2013.01); *H01L 41/09* (2013.01); *H03H 9/02275* (2013.01); *G06F 3/0423* (2013.01); *H04N 5/225* (2013.01)

(58) Field of Classification Search
    CPC ......... G01L 1/18; G01L 1/16; H03H 9/02275; H01L 41/09; H04N 5/225
    USPC .................... 359/200.8, 224.1, 212.1, 221.2; 73/504.12, 504.04, 504.16
    See application file for complete search history.

(56) References Cited

U.S. PATENT DOCUMENTS

| | | | | |
|---|---|---|---|---|
| 8,559,086 | B2 | 10/2013 | Davis et al. | |
| 8,654,426 | B2 * | 2/2014 | Yamada | G02B 26/0858 |
| | | | | 359/212.1 |
| 8,730,549 | B2 * | 5/2014 | Aimono | G02B 26/0858 |
| | | | | 359/224.1 |
| 8,817,351 | B2 * | 8/2014 | Koyama | G02B 26/0858 |
| | | | | 359/200.8 |
| 9,151,947 | B2 * | 10/2015 | Aimono | G02B 26/08 |
| 9,291,817 | B2 * | 3/2016 | Hashiguchi | G02B 26/105 |
| 9,383,578 | B2 * | 7/2016 | Tanaka | G01B 11/25 |
| 9,470,503 | B2 * | 10/2016 | Gerson | G01B 7/003 |
| 9,593,013 | B2 * | 3/2017 | Iyad Al Dibs | G02B 26/0833 |
| 9,729,038 | B2 * | 8/2017 | Takimoto | H02K 33/18 |
| 9,739,998 | B2 * | 8/2017 | Muchow | G02B 26/00 |
| 2004/0211256 | A1 * | 10/2004 | Geen | G01C 19/5719 |
| | | | | 73/504.04 |
| 2006/0181756 | A1 * | 8/2006 | Yamazaki | G02B 26/0833 |
| | | | | 359/224.1 |
| 2011/0199284 | A1 | 8/2011 | Davis et al. | |
| 2011/0292479 | A1 * | 12/2011 | Hiraoka | G02B 26/0858 |
| | | | | 359/199.1 |
| 2012/0162739 | A1 | 6/2012 | Yamada | |
| 2012/0327494 | A1 * | 12/2012 | Koyama | G02B 26/0858 |
| | | | | 359/200.8 |
| 2012/0327495 | A1 * | 12/2012 | Aimono | G02B 26/0858 |
| | | | | 359/224.1 |
| 2013/0083378 | A1 | 4/2013 | Tanaka et al. | |
| 2013/0208330 | A1 * | 8/2013 | Naono | G02B 26/10 |
| | | | | 359/200.1 |
| 2013/0301103 | A1 | 11/2013 | Aimono | |
| 2013/0308173 | A1 | 11/2013 | Muchow et al. | |
| 2014/0117888 | A1 | 5/2014 | Iyad Al Dibs et al. | |
| 2015/0077823 | A1 * | 3/2015 | Hashiguchi | G02B 26/105 |
| | | | | 359/200.8 |
| 2015/0124304 | A1 * | 5/2015 | Tanaka | G01B 11/25 |
| | | | | 359/198.1 |
| 2015/0241196 | A1 | 8/2015 | Gerson | |
| 2015/0270477 | A1 * | 9/2015 | Horie | H01L 41/0933 |
| | | | | 310/300 |
| 2017/0160540 | A1 * | 6/2017 | Giusti | G02B 26/105 |

OTHER PUBLICATIONS

IT Search Report and Written Opinion for IT 102016000033284 dated Dec. 1, 2016 (12 pages).

* cited by examiner

(PRIOR ART)

MEMS DEVICE OSCILLATING ABOUT TWO AXES AND HAVING A POSITION DETECTING SYSTEM, IN PARTICULAR OF A PIEZORESISTIVE TYPE

PRIORITY CLAIM

This application claims priority from Italian Application for Patent No. 102016000033284 filed Mar. 31, 2016, the disclosure of which is incorporated by reference.

TECHNICAL FIELD

The present invention relates to a MEMS (Micro-Electro-Mechanical System) device oscillating about two axes and having a position detecting system, in particular of a piezoresistive type. In particular, the MEMS device forms a micromirror.

BACKGROUND

Micromechanical devices are known having a micromirror structure manufactured using the semiconductor technology.

These micromechanical devices are used in portable apparatuses, such as, for example, portable computers, laptops, notebooks (including ultra thin notebooks), PDAs, tablets, and smartphones, for optical applications, in particular for directing light radiation beams generated by a light source with desired modalities.

By virtue of their small dimensions, these devices can meet stringent requirements as regards bulk, both as area and thickness.

For instance, micromechanical mirror devices are used in miniaturized projector modules (so-called picoprojectors), which are able to project images at a distance or to generate desired light patterns.

In combination with an image capture module, a projector module of this kind, for example, forms a three-dimensional (3D) photo- or videocamera for three-dimensional imaging. Alternatively, projector modules may be used in 3D-scene reconstruction systems that measure the time taken by a monochromatic ray emitted by the picoprojector to strike a surface and to be reflected backwards, towards a receiver (so-called time-of-flight method). Another application measures the position of the reflected ray or beam, for example of an infrared type, on an array of detectors, where the position of the reflected ray or beam depends upon the distance of the reflecting surface (so-called structured light deformation method).

Micromirror devices generally include a mirror element suspended over a cavity and formed from a semiconductor body so as to be movable, for example, with a roll and pitch movement, to direct the incident light beam as desired.

Figure 1:
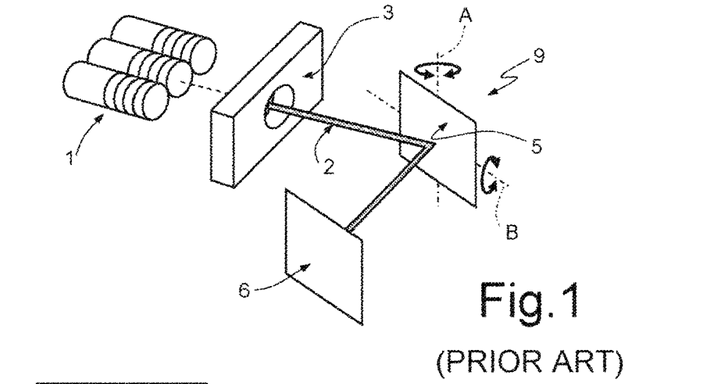
FIG. 1 is a schematic representation of a picoprojector.
Figure 2:
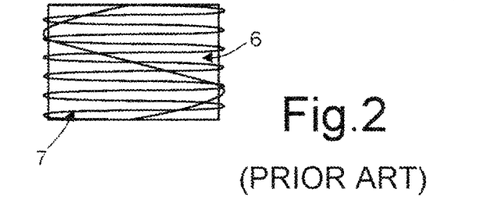
FIG. 2 shows the projection scheme of an image generated by the picoprojector of FIG. 1 on a screen.

For instance, FIG. 1 schematically shows a picoprojector 9 comprising a light source 1, such as a laser source, generating a light beam 2 of three monochromatic beams, one for each base color, which, through an optical system 3 shown only schematically, is deflected by a mirror element 5 towards a screen 6. The mirror element 5 is of a two-dimensional type, controlled so as to turn about a vertical axis A and a horizontal axis B. Rotation of the mirror element 5 about the vertical axis A generates, on the screen 6, a fast horizontal scan, as illustrated in FIG. 2. Rotation of the mirror element 5 about the horizontal axis B, perpendicular to the vertical axis A, generates a slow vertical scan, generating as a whole a sawtooth scan.

Figure 3:
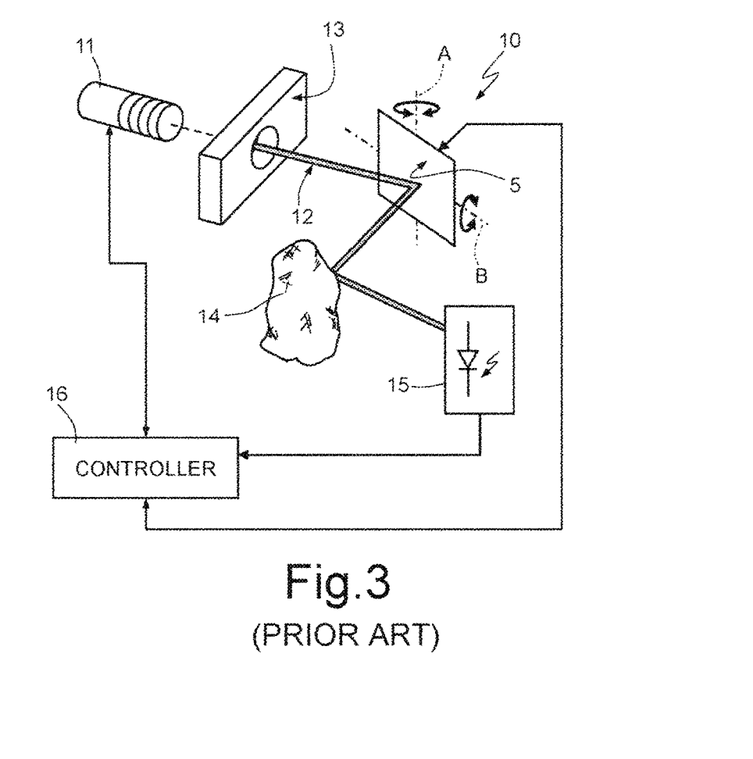
FIG. 3 shows the basic diagram of a scene or gesture detection system that uses a MEMS micromirror.

In the scene reconstruction system of FIG. 3, instead, a source 11, for example a monochromatic infrared source, generates a light ray 12, which, through an optical focusing system 13, shown only schematically, is deflected by the mirror element 5 towards an object 14 and reflected by the latter onto a detector 15. A controller 16, connected to the source 11, to the mirror element 5 and to the detector 15, determines the time of flight used for scene reconstruction. Alternatively, as mentioned, the scene may be reconstructed via the structured light deformation method.

Rotation of the mirror element 5 is controlled via an actuation system, which, currently, is of an electrostatic, electromagnetic, or piezoelectric type.

Figure 4:
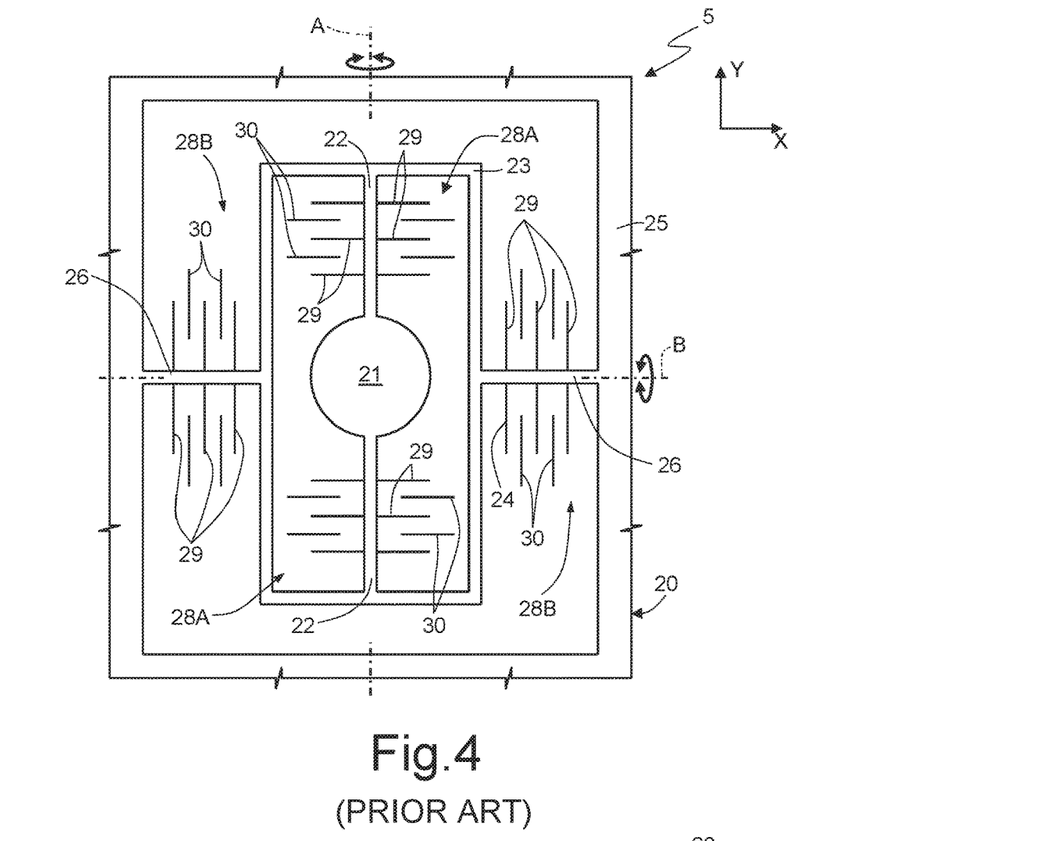
FIG. 4 is a schematic top view of a micromirror device with an electrostatic actuation.

For instance, FIG. 4 shows a mirror element 5 with electromagnetic actuation. Here, a chip 20 comprises a platform 21, suspended over a substrate (not visible), which has a reflecting surface (not illustrated) and is supported by a suspended frame 23 by a first pair of arms 22 (first torsion springs). The first arms 22 extend from opposite sides of the platform 21 and define rotation axis A of the mirror element 5. The suspended frame 23 is connected to a fixed peripheral portion 25 of chip 20 via a second pair of arms 26 (second torsion springs), which enable rotation of the suspended frame 23 and of the platform 21 about the horizontal axis B. The first and second arms 22, 26 are coupled to respective actuation assemblies 28A, 28B of an electrostatic type. Each actuation assembly 28A, 28B here comprises first electrodes 29 facing respective second electrodes 30.

In detail, the first electrodes 29 are fixed with respect to the respective arms 22, 26 and are comb-fingered with respect to the second electrodes 30 so as to generate a capacitive coupling. Due to the arrangement of the electrodes 29, 30 of each actuation assembly 28A, 28B, the driving structure is also defined as comb-drive structure.

By applying appropriate voltages between the first electrodes 29 and the second electrodes 30, it is possible to generate attraction/repulsion forces between them and thus cause rotation of the first electrodes 29 with respect to the second electrodes 30 and torsion of the arms 22, 26 about the respective axes A, B. In this way, controlled rotation of the platform 21 (and of the reflecting surface, not shown) with respect to axes A, B is obtained and thus scanning in the horizontal and in the vertical directions.

In the above applications, in particular for scene or gesture recognition, high positioning precision of the mirror element 5 is required, i.e., accurate knowledge of the position thereof.

Consequently, position acquisition systems are under study tailored for MEMS devices and based upon position sensors integrated in the mirror element 5.

For instance, United States Patent Application Publication No. 2011/0199284 (incorporated by reference) describes a piezoresistive sensor formed by at least one bridge element arranged near the first torsion springs (referred to as "flexures"), between the platform and the frame so that the torsional component of the output signal is amplified and the non-torsional component is attenuated or even eliminated.

The above known solution enables elimination of the components of the output signal due to undesired effects (disturbance), for example, components due to process spread and variations of material characteristics, which cause deformations of the torsion springs other than deformation controlled by the actuation system, in particular torsion spring bending.

It does not, however, enable discrimination of deformations of the structure that involve a spurious torsion of the torsion springs, for example, when (in the embodiment of FIG. 4) actuation of the second arms 26 causes a torsional deformation of the suspended frame 23 and of the corresponding torsion springs 22. Furthermore, with the sensors described in the above patent publication, it is not possible to control both the angular positions and it is necessary to have respective sensors.

There is a need in the art to provide a position detecting system that overcomes the limitations of prior art solutions.

SUMMARY

According to the present invention, a MEMS micromirror device and a corresponding position detecting method are provided.

In an embodiment, a MEMS device comprises: a platform; a frame supporting the platform through elastic connection elements configured to enable rotation of the platform about a first axis; a bearing structure supporting the frame through elastic suspension elements configured to enable rotation of the frame about a second axis transverse to the first axis; and a stress sensor arranged on the elastic suspension elements, wherein the elastic suspension elements are anchored to the bearing structure through respective anchorage portions arranged offset with respect to the second axis.

In an embodiment, a position detecting method for a MEMS device comprises the steps of: acquiring first and second measure signals generated by a first and a second stress sensor elements coupled to respective elastic suspension elements of a frame supporting a platform rotating about a first axis, the frame being rotatably supported about a second axis by the elastic suspension elements anchored to a fixed structure through respective anchorage portions arranged offset with respect to the second axis; adding the first and second measure signals to obtain a sum signal; and subtracting the first and second measure signals to obtain a difference signal; wherein a signal between the sum signal and the difference signal indicates an angle of rotation about the first axis, and wherein another signal between the sum signal and the difference signal indicates an angle of rotation about the second axis.

In an embodiment, a MEMS device comprises: a platform carried by a frame via elastic connection elements configured to enable rotation of the platform about a first axis; a bearing structure supporting the frame through first and second elastic suspension arms configured to enable rotation of the frame about a second axis transverse to the first axis; wherein the first and second elastic suspension arms are anchored to the bearing structure through respective anchorage portions arranged offset with respect to the second axis; and a stress sensor formed by first and second sensor elements respectively arranged on the first and second suspension arms and positioned in proximity of the anchorage portions, on a same side of the second axis, in a symmetrical position with respect to the first axis.

BRIEF DESCRIPTION OF THE DRAWINGS

For a better understanding of the present invention preferred embodiments thereof are now described, purely by way of non-limiting example, with reference to the attached drawings, wherein.

DETAILED DESCRIPTION

Figure 5:
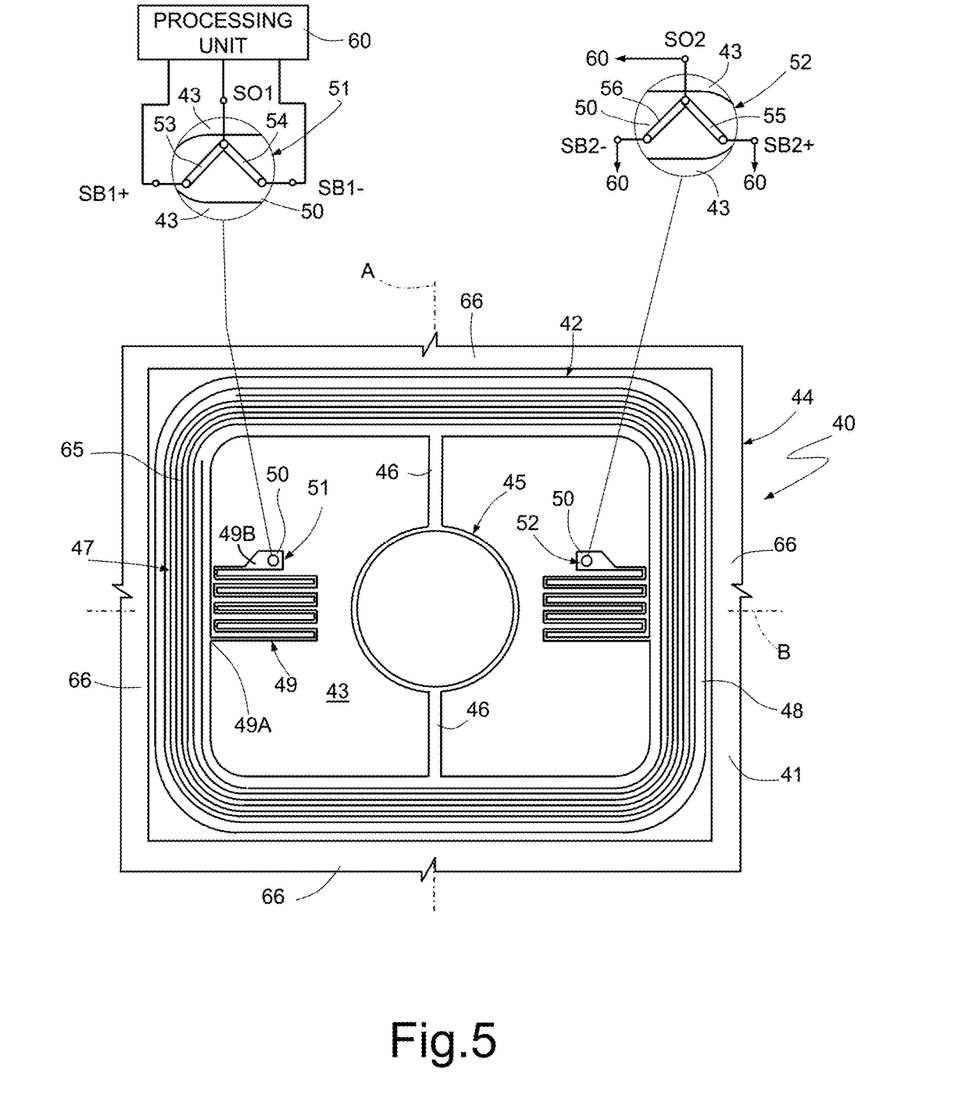
FIG. 5 is a top view of an embodiment of the present MEMS micromirror device.

FIG. 5 shows a MEMS device 40, here a micromirror, comprising a fixed structure 41 and a suspended structure 42. The suspended structure 42 extends within a cavity 43 delimited on the outside by the fixed structure 41. The fixed structure 41 comprises a substrate (not visible), which extends underneath the cavity 43 and the suspended structure 42. In a not illustrated way, common to MEMS structures, the fixed structure 41, the suspended structure 42, and the cavity 43 are formed from a die 44 of semiconductor material, for example, silicon, using known semiconductor manufacturing techniques, such as growth, deposition and/or selective removal, in a per se known manner.

The suspended structure 42 comprises an orientable structure 45 carried, through a first pair of arms or torsion springs 46 (hereinafter also referred to as "elastic connection elements"), by a frame 48, also suspended and surrounding the orientable structure 45. In turn, the frame 48 is carried by the fixed structure 41 via a second pair of arms or torsion springs 49 (also referred to hereinafter as "elastic suspension elements").

The first arms 46 have a linear shape, extend along a first rotation axis A and are configured to enable the orientable structure 45 to turn about the first rotation axis A.

The second arms 49 have here a serpentine shape and are configured to enable the frame 48 to turn mainly about a second rotation axis B and, to a lesser extent, about the first rotation axis A, as explained in greater detail hereinafter.

The second arms 49 each have a first end 49A connected to the frame 48 and a second end 49B connected to the fixed structure 41 via a respective anchorage portion 50. Both the first ends and the second ends of the second arms 49 (and thus the anchorage portions 50) are offset with respect to the second axis B. In detail, the first ends 49A of the second arms 49 are arranged on a same first side of the second rotation axis B (in the drawing, below), and the second ends 49B of the second arms 49 are arranged on a same second side of the second rotation axis B (in the drawing, over). Furthermore, the second arms 49, as a whole, are arranged centered with respect to the second axis B so that the center of mass of the suspended structure 42 coincides at least approximately with the intersection point between the first and second axes A, B. The MEMS device 40 as a whole, is also symmetrical with respect to the first rotation axis A.

In the case considered, the first axis A is also referred to hereinafter as "fast axis", and rotation about this first axis A causes a differentiated fast movement of the suspended structure 42 (resonant movement), as explained hereinafter. The second axis B is also referred to hereinafter as "slow axis", and rotation about this second axis B causes an in-phase slow movement of the entire suspended structure 42.

In the embodiment illustrated, two sensors 51, 52, here of a piezoresistive type, are each arranged on a respective second arm 49 at or in proximity of the anchorage portions 50, as shown in the enlarged details of FIG. 5. For instance, the sensors 51, 52 may be arranged in an area where the stress is at least 80% with respect to an area where it has a maximum value (maximum stress area). The sensors 51, 52 are arranged in a symmetrical position with respect to the first rotation axis A. Thus, due to the offset position of the anchorage portions 50, also the sensors 51, 52 are arranged offset to the second rotation axis B.

In particular, each sensor 51, 52 comprises here two piezoresistive resistors 53, 54 and, respectively, 55, 56 connected in half-bridge configuration and arranged at ±45° with respect to the second rotation axis B. The piezoresistive resistors 53-56 are, for example, made as implanted or diffused regions (e.g., of an N type, in the case of frame 48 and internal portion 41A of a P type), within the silicon layer that forms the suspended structure 42 and the top part of the fixed structure 41.

In the example illustrated, the first piezoresistive resistor 53 of the first sensor 51 has a first terminal connected to a first node SB1+, in turn coupled to a position processing unit 60 (see also FIG. 16), and a second terminal connected to a second node S01, also coupled to the processing unit 60. The second piezoresistive resistor 54 of the first sensor 51 has a first terminal connected to a third node SB1−, also coupled to the processing unit 60, and a second terminal connected to the second node S01.

Likewise, the first piezoresistive resistor 55 of the second sensor 52 has a first terminal connected to a fourth node SB2+, in turn coupled to the processing unit 60, and a second terminal connected to a second node S02, coupled to the processing unit 60. The second piezoresistive resistor 56 of the second sensor 52 has a first terminal connected to a fifth node SB2−, also coupled to the processing unit 60, and a sixth terminal connected to the fifth node S02.

In the embodiment of FIG. 5, the first node SB1+, the third node SB1−, the fourth node SB2, and the sixth node SB2+ are mutually aligned along a straight line parallel to and not coinciding with the rotation axis B, and the second and third nodes are arranged in an offset position with respect to the second rotation axis. The two piezoresistive resistors 53, 54 and, respectively, 55, 56 are thus arranged mutually symmetrically with respect to a symmetry axis parallel to the first rotation axis A, and the sensors 51, 52 are arranged symmetrically with respect to the first rotation axis A.

In the embodiment illustrated, movement of the orientable structure 45 occurs electromagnetically through an actuation structure 47 comprising a coil and a magnetic structure. In particular, in the illustrated example, the frame 48 has a generally rectangular annular shape, having four sides, parallel two by two to the rotation axes A, B. A coil 65 extends above the frame 48, where it forms at least one turn, here a plurality of turns. The magnetic structure may be formed by magnetic elements, for example, external to the die 44. In particular, the mutual arrangement between the magnetic elements and the die 44 is as to generate a magnetic field inclined at approximately 45° with respect to axes A, B for allow driving around both axes A, B.

Figure 6:
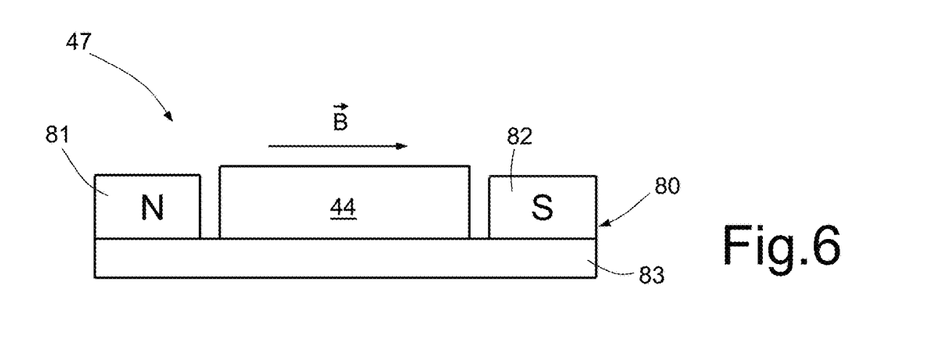
FIGS. 6 and 7 are, respectively, a side view and a top view of a system including the micromirror device of FIG. 5.
Figure 7:
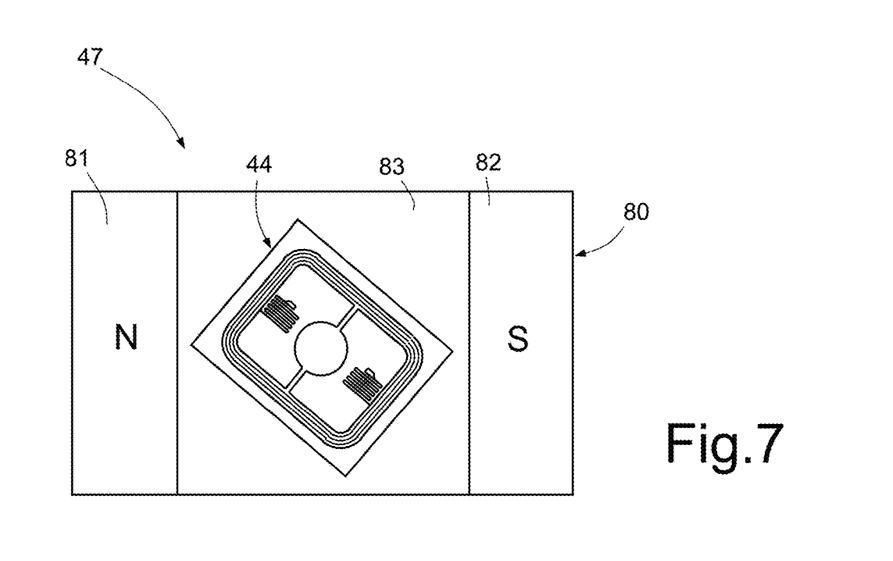

For instance, FIGS. 6 and 7 show a possible arrangement where a C-shaped magnetic element 80 has a first magnetic pole 81 and a second magnetic pole 82, arranged at a distance from each other and carried by a support 83, for example of ferromagnetic or even non-magnetic material. The die 44 is carried by the support 83, between the magnetic poles 81, 82, and is arranged at 45° with respect to the direction of the magnetic field $\vec{B}$ generated by the magnetic element 80, as may be seen in particular in FIG. 7.

With the described solution, by supplying an alternating current at preset frequencies, it is possible to rotate the orientable structure about the two axes A, B. In particular, by simultaneously feeding the coil 65 with two currents of appropriate amplitudes and at different frequencies, one whereof is close to the resonance frequency, these generate a magnetic field, which, by induction, causes rotation of the frame 48 about the second axis B and of the orientable structure 45 about the first axis A.

In detail, an alternating current at a first frequency f1 (for example, a low frequency, such as 60 Hz) and with a first amplitude (for example, 100 mA) supplied to the coil 65 causes an in-phase rotation of the frame 48 with the orientable structure 45 (roll movement) about the second rotation axis B, of the desired value (and at frequency f1). An alternating current at a second frequency f2, higher than the first and close to the resonance frequency (for example, 20 kHz) and with a second amplitude, for example, of 100 mA, supplied at the same time to the coil 65, causes a small rotation of the frame 48 about the first rotation axis A. This small rotation is amplified by resonant effect by the orientable structure 45, also due to the characteristics of the first springs 46, thus obtaining a rotation of the orientable structure 45 about the first rotation axis A of the desired value (and at the frequency f2), i.e., a resonance movement of the orientable structure 45, hereinafter also referred to as movement of "pitch" of the suspended structure 42.

Rotation of the frame 48 about each rotation axis A, B is detected and discriminated through the sensors 51 and 52 as described hereinafter, exploiting the different stresses caused by each rotation on the second arms 49, also with reference to FIGS. 8, 9, 10A-10B. These figures show the stresses on the anchorage portions 50 due to the rotations of the suspended structure 42 caused by the actuation assembly 47, exploiting the superposition principle.

Figure 8:
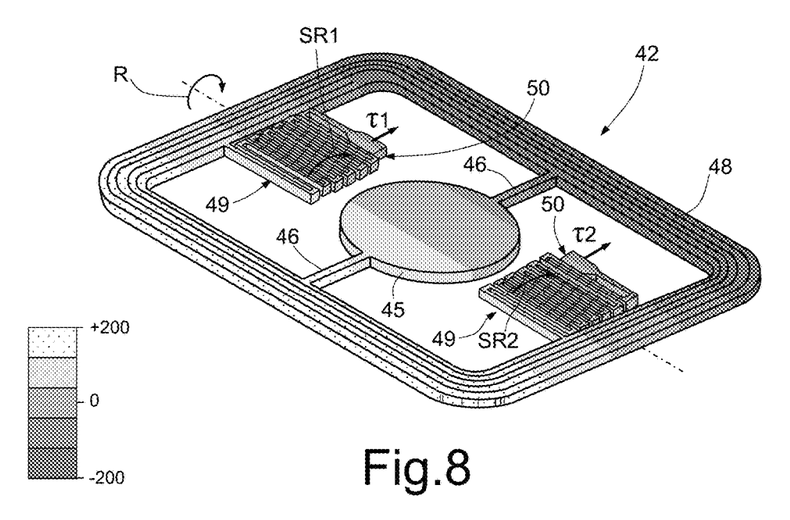
FIGS. 8 and 9 show, in perspective view, the micromirror device of FIG. 5 in two different driving conditions.

In detail, FIG. 8 shows the suspended structure 42 when rotating only about the second rotation axis B (roll movement, at low speed, indicated in the figure by arrow R). In the simulation of FIG. 8, corresponding to a rotation R of a preset angle θ (for example, 10°) of the frame 48, the arrows SR1 and SR2 indicate the corresponding rotations of the second arms 49, in the same direction. In FIG. 8, the shading with decreasing grey levels represents displacements of the structure from negative to positive values, for example, from −200 μm to +200 μm.

As may be noted, for the rotation of FIG. 8, the simulation shows that the anchorage portions 50 of the second arms 49 are subjected to stresses τ1, τ2 of equal amplitude and oriented in the same direction. In this condition, by biasing the sensors 51, 52 with a d.c. voltage (for example, of 1 V) between the third node SB1− and the first node SB1+ and, respectively, between the sixth node SB2− and the fourth node SB2+, the voltages present on the second node SO1 and on the fifth node SO2 are the same (FIGS. 8A and 8B). The effective movement, controlled in a sinusoidal way at the low frequency f1, thus gives rise to in-phase output voltages on the second node SO1 and on the fifth node SO2.

The addition of these signals thus yields a signal, the amplitude whereof provides an indication of the value of the effective rotation angle θ. Instead, the subtraction between these signals yields a zero signal.

Figure 9:
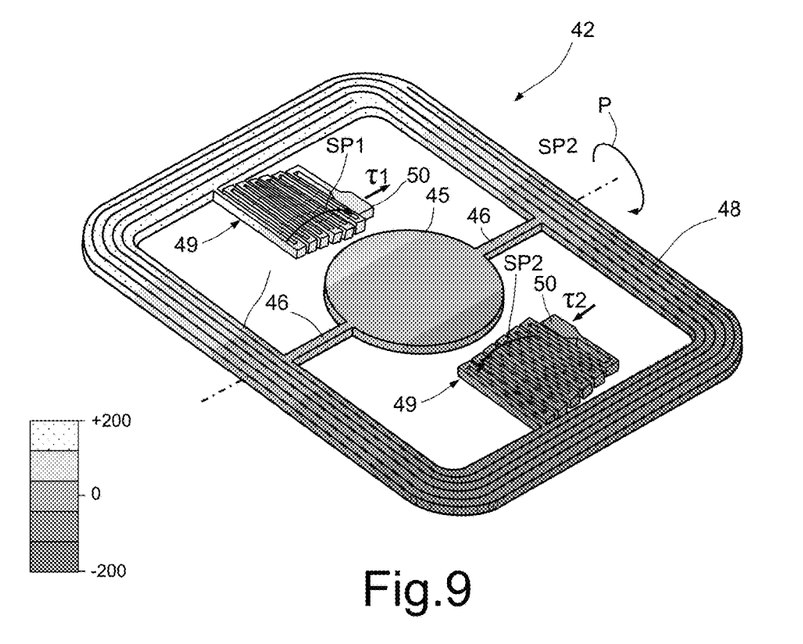
Figure 10A:
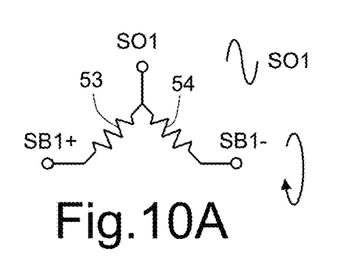
FIGS. 10A and 10B show the electrical equivalents of two details of the micromirror device of FIG. 5 in the driving condition of FIG. 8.
Figure 10B:
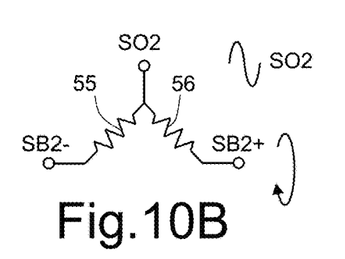
Figure 11A:
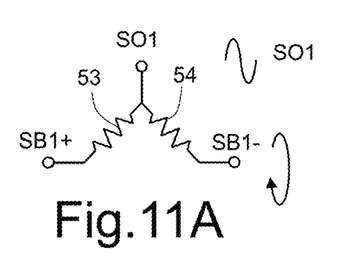
FIGS. 11A and 11B show the electrical equivalents of two details of the micromirror device of FIG. 5 in the driving condition of FIG. 9.
Figure 11B:
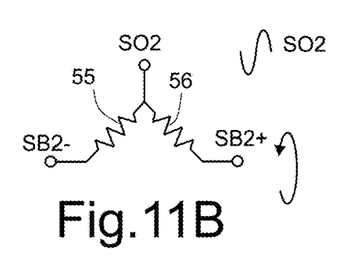
Figure 12A:
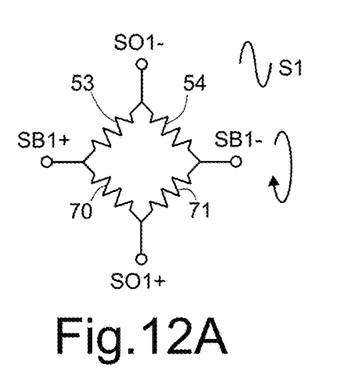
FIGS. 12A and 12B show the electrical equivalents of alternative embodiments of the two details of the micromirror device of FIG. 5 in the driving condition of FIG. 8.
Figure 12B:
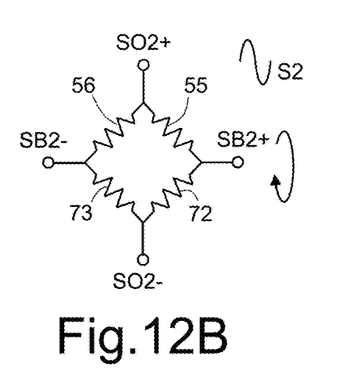
Figure 13A:
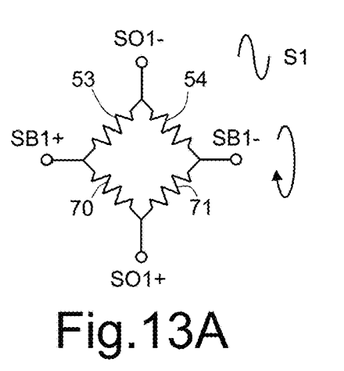
FIGS. 13A and 13B show the electrical equivalents of alternative embodiments of the two details of the micromirror device of FIG. 5 in the driving condition of FIG. 9.
Figure 13B:
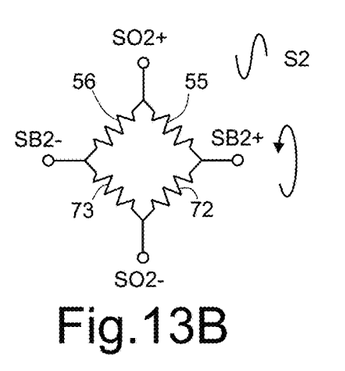

Instead, a pitch movement (rotation of the suspended structure 42 about the first rotation axis A) gives rise to opposite voltages, as shown in FIGS. 9, 11A, and 11B. In detail, FIG. 9 shows the suspended structure 42 when rotating about just the first rotation axis A (arrow P). In FIG. 9, a rotation P by a preset angle α (for example, 10°) of the suspended structure 42 causes a torsion of the second arms 49 in the opposite direction, as indicated by the arrows SP1 and SP2. Also in the simulation of FIG. 9, the shading with decreasing grey levels represents displacements of the structure from negative values to positive values, for example, from −200 μm to +200 μm.

As may be noted, for the rotation in FIG. 9, the simulation shows that the anchorage portions 50 of the second arms 49 are subjected to stresses τ1, τ2 of the same amplitude, but oriented in opposite directions. In this condition, by biasing the sensors 51, 52 with a d.c. voltage (for example, of 1 V) between the third node SB1− and the first node SB1+ and, respectively, between the sixth node SB2− and the fourth node SB2+, the voltages on the second node SO1 and on the fifth node SO2 are opposite (FIGS. 9A and 9B). The effective movement, controlled in a sinusoidal way at the high frequency f2, thus gives rise to output voltages on the second node SO1 and on the fifth node SO2 that are in phase opposition.

If these signals are added, thus a zero signal is obtained. Instead, if these signals supplies are subtracted, a non-zero signal is obtained, the amplitude whereof indicates the value of the effective rotation angle α.

Thus, in general, in case of rotations about both axes A, B, the sum of the signals supplied by the sensors 51, 52 yields an indication of the roll angle (about the second rotation axis B), and their difference yields an indication of the pitch angle (about the first rotation axis A).

As mentioned, the signals supplied on the second node SO1 and on the fifth node SO2 (designated for simplicity by the same names SO1, SO2) may be supplied to a position processing unit, as explained hereinafter with reference to FIG. 16.

In particular, each signal SOi, with i=1, 2, is given by:

$$SOi = (\Sigma \Pi_k \sigma_{k,i}) V_{bias} \quad i=1,2 \quad (1)$$

where:

$\Pi_k$ [Pa$^{-1}$] are the components of the tensor representing piezoresistive coefficients of the material of the piezoresistors 53-56 (doped silicon);

$\sigma_k$ [Pa] $\sigma_k$ [Pa] are the components of the stress tensor; and $V_{bias}$ $V_{bias}$ is a biasing voltage, equal to the potential difference between SB$_i$− and SB$_i$+.

Eq. (1) may be rewritten as follows, highlighting the rotation caused by the measured stress state:

$$SOi_{roll} = G_{roll} \theta V_{bias} \quad SOi_{roll} = G_{roll} \theta V_{bias} \text{ (for the roll movement)}$$

$$SOi_{pitch} = G_{pitch} \alpha V_{bias} \quad SOi_{roll} = G_{roll} \theta V_{bias} \text{ (for the pitch movement)}$$

where:

$G_{roll}$, $G_{pitch}$ [mV/° C./V] is the sensitivity of the sensor for the respective roll and pitch movements; and θ and α are the sought angles.

The sign of the signal SOi at output thus depends upon the biasing between SBi− and SBi+ and upon the direction of the shear stress τ due to torsion of the second arm or spring 49 associated to the considered sensor 51, 52.

The values of the thus obtained angles θ and α may be processed for controlling the position of the suspended structure 42, as discussed hereinafter.

FIGS. 12A, 12B, 13A, and 13B show electrical equivalents of a different embodiment of the sensors 51, 52. In detail, here, each sensor 51, 52 comprises four piezoresistive resistors, and, precisely, in addition to the resistors 53-56 shown in FIG. 5, the first sensor 51 comprises two further piezoresistive resistors 70, 71 (represented only via the electrical equivalents, but similar to the piezoresistors 53-54), and the second sensor 52 comprises two further piezoresistive resistors 72, 73 (similar to the piezoresistors 55-56) so as to form two full-bridge structures. Also resistors 70-71 and 72-73 are arranged at ±45° with respect to the second rotation axis B, are connected between nodes SB1+, SB1− and, respectively, SB2−, SB2+, and define intermediate nodes SO1+ and SO2−. In FIGS. 12A-13B the intermediate nodes between the piezoresistive resistors 53-56 are designated by SO1− and SO2+.

Also in this case, signals S1 and S2 between the intermediate nodes SO1−, SO1+ and, respectively, between the intermediate nodes SO2+, SO2− are concordant and in phase for roll movements and in phase opposition for pitch movements. Their addition and subtraction thus enables also in this case discrimination of the information regarding the respective angles θ and α.

The solution of FIGS. 12A, 12B, 13A, and 13B enables doubling of the sensitivity, at the expense of a greater complexity and occupation of area due to the presence of a further two outputs SO1+ and SO2−.

Figure 14:
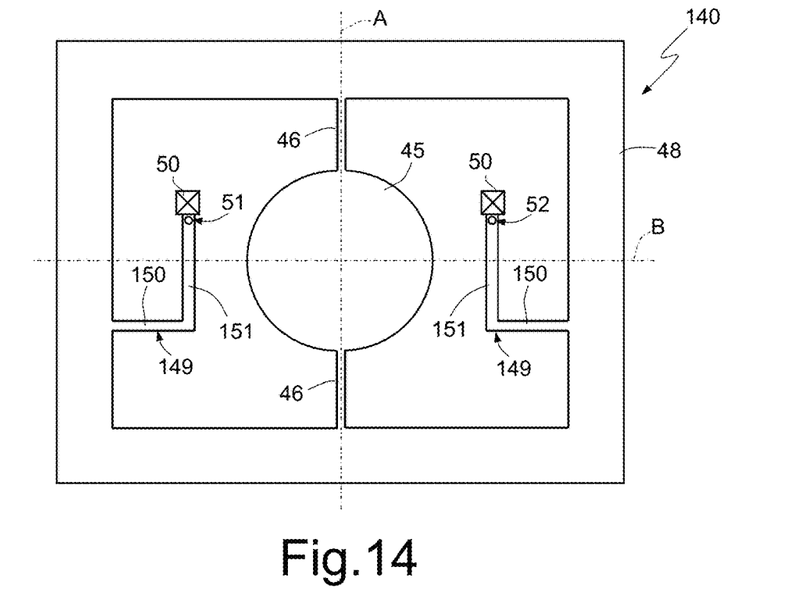
FIGS. 14 and 15 show different embodiments of the present MEMS micromirror device.

FIG. 14 shows an embodiment of a MEMS device 140, where the second arms, here designated by 149, are L-shaped. In this figure, elements equal to those of FIG. 5 are designated by the same reference numbers.

In detail, in FIG. 14, each second arm 149 comprises a first portion 150 extending from the frame 48 inwards, parallel to the second rotation axis B, and a second portion 151 extending parallel to the first rotation axis A, from the respective first portion 150 as far as the respective anchorage portion 50.

As in FIG. 5, the MEMS device 140 has sensors 51, 52 arranged at or in proximity to the anchorage portions 50, in a position off the second rotation axis B. The sensors 51, 52 are made as represented in the details of FIG. 5 or in the variants of FIGS. 12A-13B.

Also the embodiment of FIG. 14 enables measure of the roll angle θ and the pitch angle α, due to the offset arrangement of the anchorage portions 50 and the arrangement of the sensors 51, 52 nearby.

Figure 15:
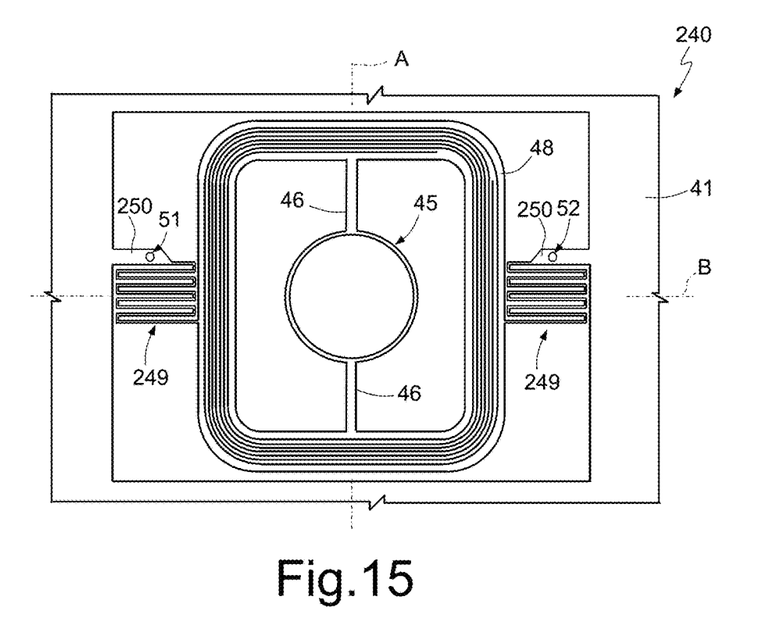

FIG. 15 shows an embodiment of a MEMS device 240, where the second arms, here designated by 249, extend from the frame 48 towards the outside thereof and are directly anchored in 250 to the fixed structure 41.

Also in the embodiment of FIG. 15, the MEMS device 240 has sensors 51, 52 arranged at or in proximity of the anchorage portions 250, away from the second rotation axis B.

Figure 16:
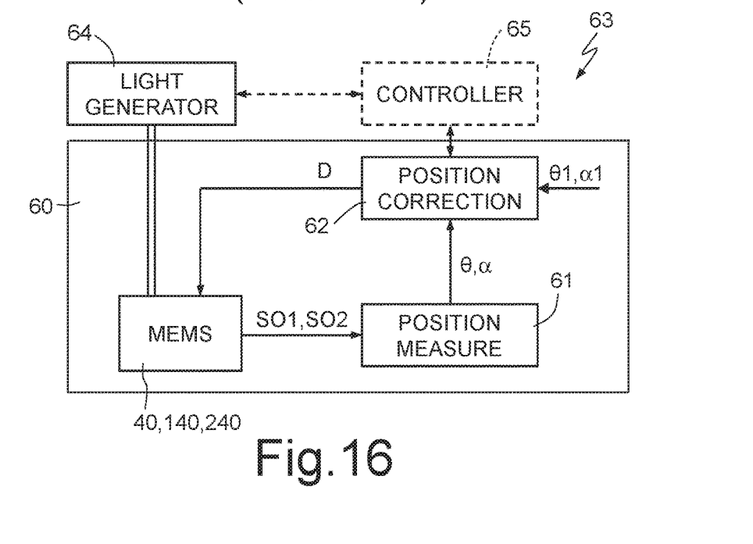
FIG. 16 shows a block diagram of a picoprojector using the micromirror device of FIG. 5, 14 or 15.

As mentioned, the MEMS device 40, 140, 240 may be part of a MEMS micromirror system 60, such as the one illustrated, for example, in FIG. 16. Here, a processing unit 61 (for example, a logic circuit and/or unit) adds and subtracts the signals SO1, SO2 and processes the sum and difference signals to obtain the values of the angles θ and α, as described above. The values of the thus measured angles θ and α may be supplied to a position correction unit 62, which, on the basis of the calculated values θ and α and the desired angular values (designated by θ1 and α1 in FIG. 16), may generate a driving signal D for the MEMS device 40. For instance, the logic unit 62 may be a simple differential amplifier stage.

The micromirror system 60 may be part of a picoprojector system 63 of the type illustrated in FIG. 1 or in the scene recognition system of FIG. 3. To this end, in FIG. 16, the picoprojector system 63 comprises a light source 64 and may comprise a controller 65. If present, the controller 65 may include the functions of the position correction unit 62.

Finally, it is clear that modifications and variations may be made to the MEMS device described and illustrated herein, without departing from the scope of the invention, as defined in the attached claims. For instance, the various embodiments described may be combined to provide further solutions.

Furthermore, the described solution may also be applied to MEMS devices of a type different from micromirrors, if the suspended structure is subjected to spatial pitch and roll movements, and it is desired to precisely measure their angular position.

The described biasings are only indicative and may be reversed in the two sensors 51, 52, obtaining inversion of the sign of the output signals. The operation carried out on these signals (addition, subtraction) thus depends upon the specific biasing chosen.

The addition and subtraction operations of the output signals SO1, SO2, S1, S2 may be carried out electrically, via appropriate circuits, or via digital processing.

The shape of the second arms 49; 149; 249 may differ from the illustrated one, provided that it is such as to enable rotation of the frame 48 about the second rotation axis B and that it enables offset arrangement of the sensors 51, 52, as discussed.

The sensors 51, 52 could be of a different type, for example, of a piezoelectric type.

The invention claimed is:
1. A MEMS device, comprising:
a platform;
a frame supporting the platform through elastic connection elements configured to enable rotation of the platform about a first axis;
a bearing structure supporting the frame through elastic suspension elements configured to enable rotation of the frame about a second axis transverse to the first axis; and
a stress sensor arranged on the elastic suspension elements;
wherein the elastic suspension elements are anchored to the bearing structure through respective anchorage portions arranged offset with respect to the second axis and located between the platform and the frame supporting the platform;
wherein the elastic suspension elements have a serpentine shape including serpentine ladder elements that extend parallel to the second axis, connected by serpentine connector elements that extend parallel to the first axis, with the serpentine ladder elements having a greater maximum length than the serpentine connector elements.

2. The device according to claim 1, wherein the stress sensor is arranged adjacent to the anchorage portions.

3. The device according to claim 1, wherein the elastic suspension elements are configured to allow the frame to rotate also about the first axis and so that the rotations of the frame about the first and second axes generate purely torsional stresses on the elastic suspension elements.

4. The device according to claim 1, wherein the elastic suspension elements comprise first and second suspension arms and the stress sensor comprises a first and a second sensor elements arranged on the first and second suspension arms, respectively.

5. The device according to claim 4, wherein the first and second sensor elements are arranged on a same side of the second axis, symmetrically with respect to the first axis.

6. The device according to claim 4, wherein the first and second sensor elements are arranged in proximity of the anchorage portions.

7. The device according to claim 4, wherein each sensor element comprises first and second resistors of a piezoresistive or piezoelectric type, the first and second resistors of each sensor element being arranged transverse to the second axis and symmetrical to each other with respect to a symmetry axis parallel to the first axis, the first and second resistors of each sensor element defining first and second biasing nodes and intermediate output nodes.

8. The device according to claim 7, wherein the first and second resistors of each sensor element are arranged at ±45° with respect to the second axis.

9. The device according to claim 7, wherein the first and second resistors of each sensor element define a half-bridge configuration.

10. The device according to claim 7, wherein each sensor element comprises a third and a fourth resistors of a piezoresistive or piezoelectric type, wherein the first, second, third, and fourth resistors of each sensor element define a bridge configuration.

11. The device according to claim 7, further comprising:
a processing unit connected to the intermediate output nodes of the sensor elements and configured to add and subtract signals at the intermediate nodes and generate measured angular position signals; and
a position correction unit configured to compare the measured angular position signals with desired position signals and to generate a driving signal.

12. The device according to claim 11, further comprising a light generator.

13. The device according to claim 1, wherein the elastic suspension elements comprise suspension arms having one of a serpentine shape or an L shape.

14. The device according to claim 13, wherein the suspension arms have a first end and a second end, the first end of each suspension arm being arranged on a first side of the second axis and the second end of each suspension arm being arranged on a second side of the second axis.

15. The device according to claim 1, wherein the MEMS device forms a MEMS micromirror.

16. A position detecting method for a MEMS device, comprising the steps of:
acquiring first and second measure signals generated by a first and a second stress sensor elements coupled to respective elastic suspension elements of a frame supporting a platform rotating about a first axis, the frame being rotatably supported about a second axis by the elastic suspension elements anchored to a fixe structure though respective anchorage portions arranged offset with respect to the second axis and located between the platform and the frame supporting the platform;

wherein the elastic suspension elements have a serpentine shape including serpentine ladder elements that extend parallel to the second axis, connected by serpentine connector elements that extend parallel to the first axis, with the serpentine ladder elements having a greater maximum length than the serpentine connector elements;

adding the first and second measure signals to obtain a sum signal; and subtracting the first and second measure signals to obtain a difference signal;

wherein a signal between the sum signal and the difference signal indicates an angle of rotation about the first axis;

wherein another signal between the sum signal and the difference signal indicates an angle of rotation about the second axis.

17. The detection method according to claim 16, further comprising the step of:

comparing the sum signal and the difference signal with respective desired signal; and generating in response to said comparing a driving signal for driving oscillation of the MEMS device.

18. A MEMS device, comprising:

a platform carried by a frame via elastic connection elements configured to enable rotation of the platform about a first axis;

a bearing structure supporting the frame through first and second elastic suspension arms configured to enable rotation of the frame about a second axis transverse to the first axis;

wherein the first and second elastic suspension arms are anchored to the bearing structure through respective anchorage portions arranged offset with respect to the second axis and located between the platform and the frame carrying the platform; and a stress sensor formed by first and second sensor elements respectively arranged on the first and second suspension arms and positioned in proximity of the anchorage portions, on a same side of the second axis, in a symmetrical position with respect to the first axis;

wherein the first and second elastic suspension arms have a serpentine shape including serpentine ladder elements that extend parallel to the second axis, connected by serpentine connector elements that extend parallel to the first axis, with the serpentine ladder elements having a greater maximum length than the serpentine connector elements.

19. A MEMS micromirror system, comprising:

a MEMS device, including:

a platform carried by a frame via elastic connection elements configured to enable rotation of the platform about a first axis;

a bearing structure supporting the frame through first and second elastic suspension arms configured to enable rotation of the frame about a second axis transverse to the first axis;

wherein the first and second elastic suspension arms are anchored to the bearing structure through respective anchorage portions arranged offset with respect to the second axis and located between the platform and the frame carrying the platform; and a stress sensor formed by first and second sensor elements respectively arranged on the first and second suspension arms and positioned in proximity of the anchorage portions, on a same side of the second axis, in a symmetrical position with respect to the first axis;

wherein each sensor element comprises first and second resistors of a piezoresistive or piezoelectric type, the first and second resistors of each sensor element being arranged transverse to the second axis and symmetrical to each other with respect to a symmetry axis parallel to the first axis, the first and second resistors of each sensor element defining first and second biasing nodes and intermediate output nodes;

a processing unit connected to the intermediate output nodes of the sensor elements and configured to add and subtract signals at the intermediate nodes and generate measured angular position signals; and a position correction unit configured to compare the measured angular position signals with desired position signals and to generate a driving sign;

wherein the first and second elastic suspension arms have a serpentine shape including serpentine ladder elements that extend parallel to the second axis, connected by serpentine connector elements that extend parallel to the first axis, with the serpentine ladder elements having a greater maximum length than the serpentine connector elements.

20. The MEMS micromirror system according to claim 19, further comprising a light generator.

21. The MEMS micromirror system according to claim 20 wherein the MEMS micromirror system forms a picoprojector.

* * * * *

UNITED STATES PATENT AND TRADEMARK OFFICE
CERTIFICATE OF CORRECTION

PATENT NO. : 10,048,491 B2
APPLICATION NO. : 15/266063
DATED : August 14, 2018
INVENTOR(S) : Massimiliano Merli et al.

Page 1 of 1

It is certified that error appears in the above-identified patent and that said Letters Patent is hereby corrected as shown below:

In the Claims
At Column 10, Claim No. 16, Line number 66, replace [fixe] with -- fixed --.
At Column 10, Claim No. 16, Line number 67, replace [though] with -- through --.

Signed and Sealed this
Twenty-third Day of October, 2018

Andrei Iancu
*Director of the United States Patent and Trademark Office*